United States Patent
Heid (12)

(10) Patent No.: US 6,545,476 B1
(45) Date of Patent: Apr. 8, 2003

(54) METHOD FOR SHIMMING A MAGNET SYSTEM OF A MR TOMOGRAPHY APPARATUS AND MR TOMOGRAPHY APPARATUS FOR THE IMPLEMENTATION OF THE METHOD

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/469,477

(22) Filed: Dec. 22, 1999

(30) Foreign Application Priority Data

Dec. 22, 1998 (DE) .......................................... 198 59 489

(51) Int. Cl.$^7$ ................................................. G01V 3/00
(52) U.S. Cl. ........................................ 324/320; 324/309
(58) Field of Search ................................ 324/320, 309, 324/307, 318

(56) References Cited

U.S. PATENT DOCUMENTS

| | | | | |
|---|---|---|---|---|
| 4,700,136 A | | 10/1987 | Yamaguchi et al. | 324/309 |
| 5,614,827 A | | 3/1997 | Heid | 324/320 |
| 5,652,515 A | * | 7/1997 | Kondo | 324/309 |
| 5,823,959 A | * | 10/1998 | Rasche | 324/309 |

* cited by examiner

*Primary Examiner*—Hezron Williams
*Assistant Examiner*—Dixomara Vargas
(74) *Attorney, Agent, or Firm*—Schiff Hardin & Waite

(57) ABSTRACT

In a method for shimming a magnet system of a MR tomography apparatus having at least one shim channel charged with a shim current and an MR tomography apparatus operating according to the method, each shim current is modified during the time of use of a k-space path.

5 Claims, 3 Drawing Sheets

METHOD FOR SHIMMING A MAGNET SYSTEM OF A MR TOMOGRAPHY APPARATUS AND MR TOMOGRAPHY APPARATUS FOR THE IMPLEMENTATION OF THE METHOD

BACKGROUND OF THE INVENTION

1. Field of the Invention

The present invention is directed to a method for shimming a magnet system in a magnetic resonance (MR) tomography apparatus, as well as to an MR tomography apparatus operating according to such a method.

2. Description of the Prior Art

In an MR tomography apparatus, the uniformity of the basic magnetic field is a critical factor. A specified magnetic field homogeneity is achieved in a defined volume on the basis of an appropriate magnet design and stationary shim measures (for example, with ferromagnetic materials applied at suitable locations). This volume, which is referred to below as the measuring volume, is typically a sphere having a diameter between 50 and 60 cm. In addition, shim coils, which further improve shimming the magnetic field, can be activated immediately before the measurement of the image data, and are normally present in an MR tomography apparatus. Usually, the entire nuclear magnetic resonance signal is employed for measuring the existing inhomogeneity, this being received by the antenna of the magnetic resonance apparatus after a non-localized excitation. Such shimming is also referred to below as "global" shimming.

U.S. Pat. No. 4,700,136 discloses that the field uniformity can be locally improved by using only the signal from the region wherein the actual measurement will later occur for setting the homogeneity. This region is referred to below as the target volume. A method that is suitable for local shimming of the basic magnetic field is disclosed, for example in U.S. Pat. No. 5,614,827. The previous goal of shimming was to compensate, by means of magnetic fields generated by the shim coils, inhomogeneities in the basic magnetic field during the entire data measurement. This local shimming, however, acts only on specific regions, i.e. a specific shim current setting can compensate only the inhomogeneity of the basic magnetic field in a specific region but cannot compensate it in others.

SUMMARY OF THE INVENTION

An object of the present invention is a number of simultaneously existing k-space paths, to reduce the influence of inhomogeneities of the basic field of the measured nuclear magnetic resonance signals.

The above object is achieved is achieved in accordance with the principles of the present invention in a method for shimming a magnet system of an MR tomography apparatus, and an MR tomography apparatus having at least one shim channel charged with a shim current, wherein each shim current is modified during the time of use of a k-space path for entering the raw data, obtained by scanning an examination subject, into k-space. Stated differently, in the method and MR apparatus of the invention, the shim currents (or at least one shim current) is modified between a time of excitation of nuclear spins in the examination subject, and a time of reading out the resulting magnetic resonance signals from the examination subject.

Due to the possibility of changing the shim current during the time of use of a particular k-space path, the possibility is provided of individually influencing various, simultaneously existing k-space paths, insofar as excitation times or readout times or the k-space paths differ. As used herein "k-space" path means the time curve (sequence) of the signal positions (entries) in k-space, this being defined as follows:

$$k_x = \gamma \int G_x \cdot x \cdot dt \quad k_y = \gamma \int G_y \cdot y \cdot dt; \quad k_z = \gamma \int G_z \cdot z \cdot dt$$

wherein Gx, Gy, Gz represent not only for the (desired) gradients generated by the gradient system but also include field inhomogeneities, and x, y, z are the coordinates of a Cartesian coordinate system, and $\gamma$ is the gyromagnetic constant. The invention is based on the perception that the basic field homogeneity is important only during the excitation and readout phases of an MR sequence. In the time intervals without excitation and readout, the time span wherein the spin dephasing is influenced is irrelevant. In general, it must be insured that the dephasing caused by the basic field inhomogeneity at the readout time is compensated by the shim fields as a time integral over the time interval between excitation and readout.

DESCRIPTION OF THE PREFERRED EMBODIMENTS

Figure 1:
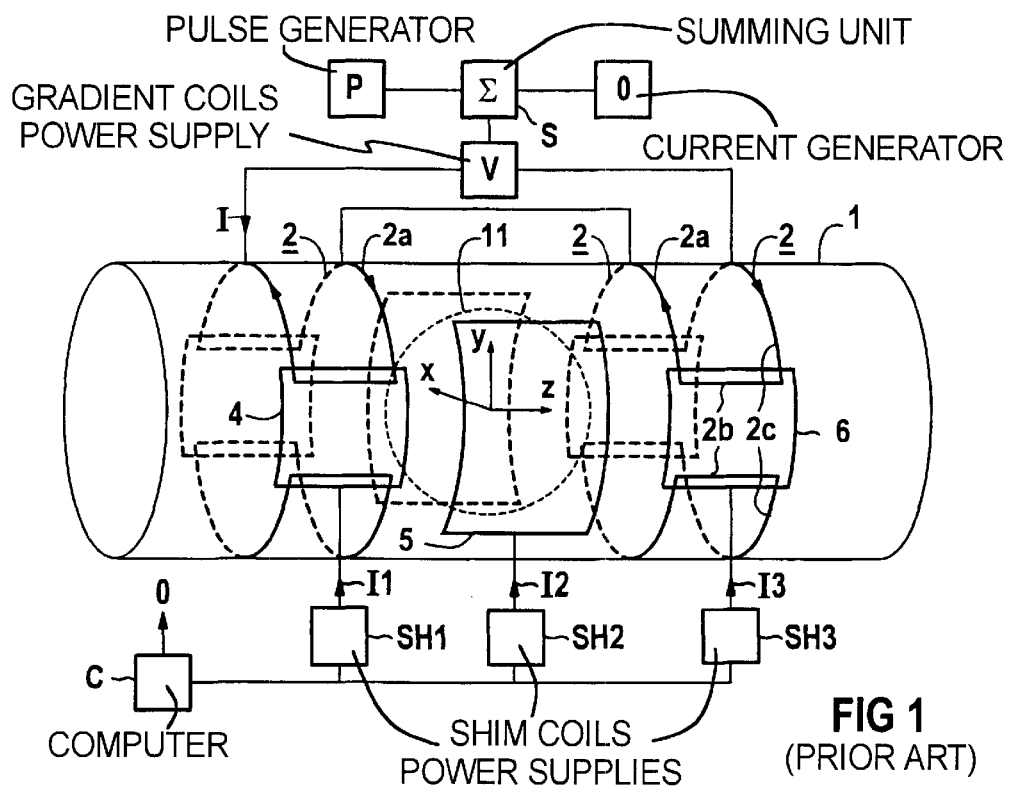
FIGS. 1 and 2 schematically show a known arrangement of the shim channels for shimming the basic field magnet of an MR tomography apparatus.

The schematic illustration of FIG. 1 shows the arrangement of gradient coils for generating a magnetic field gradient Gy in the y-direction according to the coordinate axes x, y, z (likewise shown) that is intended to represent the direction of the respective gradients. The gradient coils are implemented as saddle coils that are secured on a carrying tube 1. A substantially constant magnetic field gradient Gy is generated in the y-direction by conductor sections 2a within a spherical examination volume 11. The return conductors, due to their greater distance from the examination volume 11, produce only negligible components therein. The gradient coils for the magnetic field gradient in the x-direction are constructed identically to the gradient coils 2 for the y-direction magnetic field gradient and are merely rotated by 90° in the azimuthal direction on the carrying tube 1. For clarity, they are therefore not shown in FIG. 1.

Shim coils 4 through 6 are also schematically shown in FIG. 1, these being likewise implemented as saddle coils. Embodiments of the design of shim coils may be found, for example, in U.S. Pat. No. 3,569,823. The shim coils 4 through 6 respectively have power supplies SH1 through SH3 allocated to them, thereby supplying the respective shim coils 4 through 6 with currents I1 through I3. The currents I1 through I3 are controllable by a computer unit C.

Figure 2:
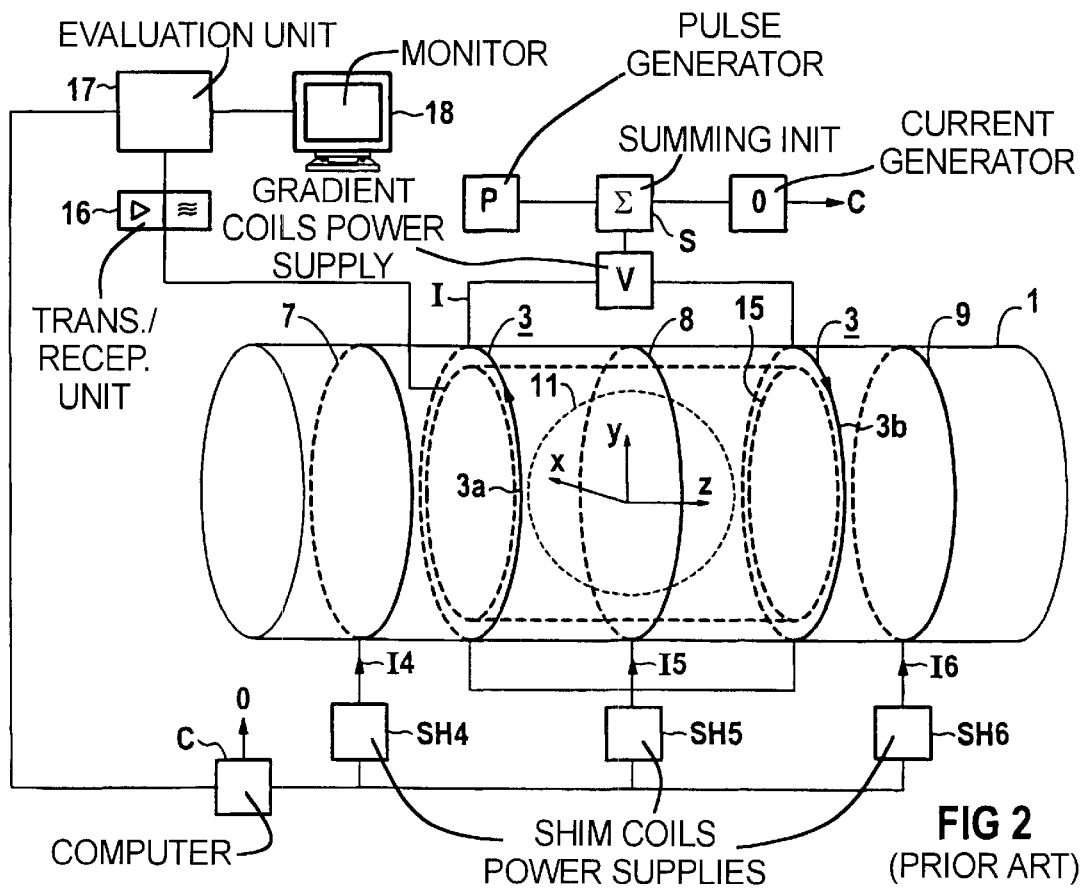

The gradient coils 3 for the magnetic field gradient in the z-direction are schematically shown in FIG. 2. The coils are annularly implemented and are arranged symmetrically relative to the mid-point of the examination volume 11. Since the two individual coils 3a and 3b have current flowing therein in opposite directions in the way shown in FIG. 2, they produce a magnetic field gradient in the z-direction. Further, more shim coils, annular shim coils 7 through 9 in this case, are also shown in FIG. 2—again only schematically—, these likewise being charged with currents I4 through I6 from respective power supplies SH4 through SH6. The currents I4 through I6 also are controlled by the computer unit C.

FIGS. 1 and 2 also schematically show the power supply V for the gradient coils 2 and 3. The current I through the respective gradient coils 2 and 3 is determined by a pulse generator P prescribing a measuring sequence and by a current generator O, the output signals of the pulse generator P and of the generator O being summed to produce offset currents. The generator O is likewise controlled by the computer unit C.

FIG. 2 also schematically shows an antenna 15 omitted from FIG. 1 for clarity. With the antenna 15, radio-frequency signals are both emitted onto an examination subject and are received therefrom as nuclear magnetic resonance signals. The transmission signals are generated in a transmission/reception unit 16 and the received nuclear magnetic resonance signals are phase-dependently demodulated therein. The demodulated nuclear magnetic resonances are interpreted in an evaluation circuit 17, first, for image information that is displayed on a monitor 18 and, second, for information about the required shimming, this information being converted into shim currents in the computer unit C.

Magnetic fields can be mathematically represented on the basis of spherical harmonic functions. The following is valid for the axial components $B_z$ of the magnetic field that are exclusively of interest here:

$$B_z(\vec{r}) = \sum_{n=0}^{\infty} (r/R)^n \sum_{m=0}^{\infty} P(n, m)(\cos\Theta)$$

$$[A(n, m)\cos(m\phi) + B(n, m)\sin(m\phi)]$$

wherein r, $\Theta$ and $\phi$ are thereby the spherical coordinates of the vector $\vec{r}$, R is the radius of the volume to be imaged, P(n, m) are the corresponding Legendre polynomials of the degree n and the order m and A(n, m) and B(n,m) are the coefficients of tile spherical harmonic functions. The coefficient A(0,0) characterizes the uniform basic field; all other coefficients describe homogeneity deviations. As already explained in the above-cited U.S. Pat. No. 3,569,823, shim coils can be fashioned such that they influence substantially only one of these coefficients, i.e. they compensate the field disturbance corresponding to this coefficient.

The linear terms of the homogeneity deviation are compensated by adding an offset current to the predetermined gradient current in the respective direction of the linear term, this being suitable for compensating the respective linear term. Higher terms of the homogeneity deviation up to a certain order are compensated by the specific shim coils.

For shimming, of course, it is necessary to identify the existing field course. Methods for this purpose are disclosed in the aforementioned U.S. Pat. No. 5,614,827.

Heretofore, the shimming was always implemented such that the field inhomogeneity was identified for a volume under consideration before the beginning of a measurement or of an entire series of measurements, and was compensated by an appropriate setting of the shim currents (that also respectively include the offset currents for the gradient coils). The problem arises, however, of an exact shimming being possible only for a part of the overall measuring volume. If a number of slices separated from one another are successively excited in a measuring procedure (as is often the case), the shimming can be exactly set for only one of the slices under consideration. Due to the non-global shimming, an inhomogeneity of the basic magnetic field that may be disturbing under certain circumstances exists for the other slices. An exact shimming within a slice is only possible for a sub-region.

Figure 3:
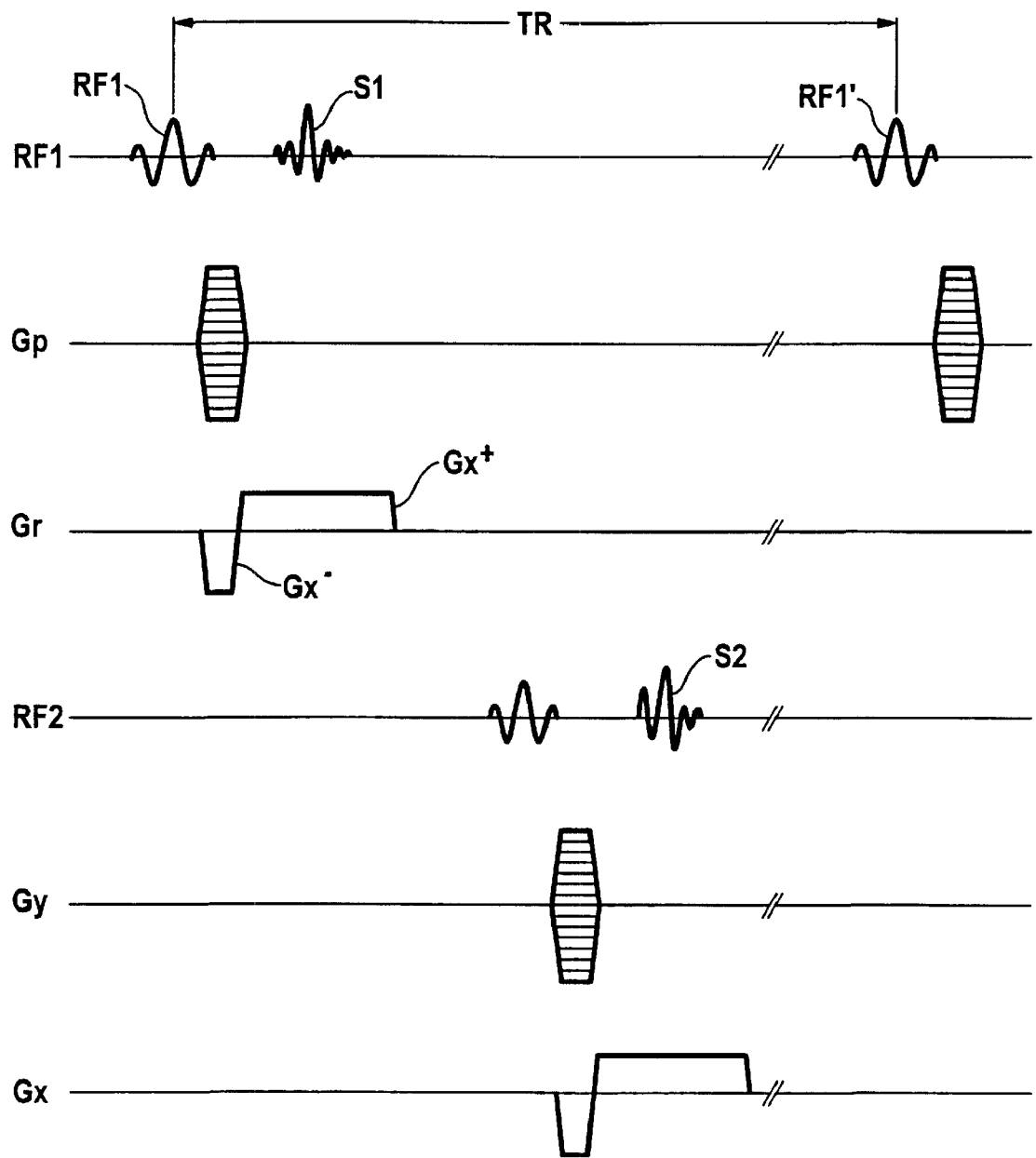
FIG. 3 illustrates an example of a known multi-slice excitation sequence for explaining the advantages of the invention.

Such a multi-slice excitation is shown as an example in FIG. 3. The slice selection gradients required for the slice-selective excitation are omitted for clarity. In the typical gradient echo sequence, a radio-frequency pulse RCA is emitted into a first slice, a phase coding in a phase coding direction subsequently ensues with a gradient Gp and a pre-phasing in negative readout direction ensues with a gradient pulse Gr$^-$. Finally, the arising gradient echo signal S1 is readout under a readout gradient pulse Gr$^+$. The sequence is repeated with different phase coding gradients Gp with a repetition time TR, i.e. further radio-frequency pulses RCA are emitted in and further gradient echo signals S1 are read out. The repetition time TR cannot be made so short that the next radio-frequency pulse RF2 immediately follows the readout phase. Otherwise, a saturation of the existing spins would occur, and adequate spins would not be available in the direction of the basic magnetic field for excitation, and thus the acquired nuclear magnetic resonance signal would drop greatly. The interspace between two excitations, however, is usually used in order to excite other slices of the examination subject. To this end, a further radio-frequency pulse RF2 is emitted after the end of the readout gradient pulse Gr$^+$, but a different slice selection gradient is effective for the pulse RF2, so that the excitation now ensues in a second slice that does not overlap with the first. Again, the spins are in turn phase-coded with a phase coding gradient Gp and are read out under a readout gradient Gr. In general, even more then two slices can be excited within a repetition time.

In the conventional shimming method, however, the aforementioned problem arises that the basic magnetic field can be exactly shimmed in only one of the slices, whereas the shim in all other slices is incomplete. This problem is then solved according to the invention by not fixing the shim currents (including the offset currents) before the beginning of the measurement, but instead controlling the shim currents in a pulse-like manner during the measurement, so that different k-space paths are differently influenced.

Figure 4:
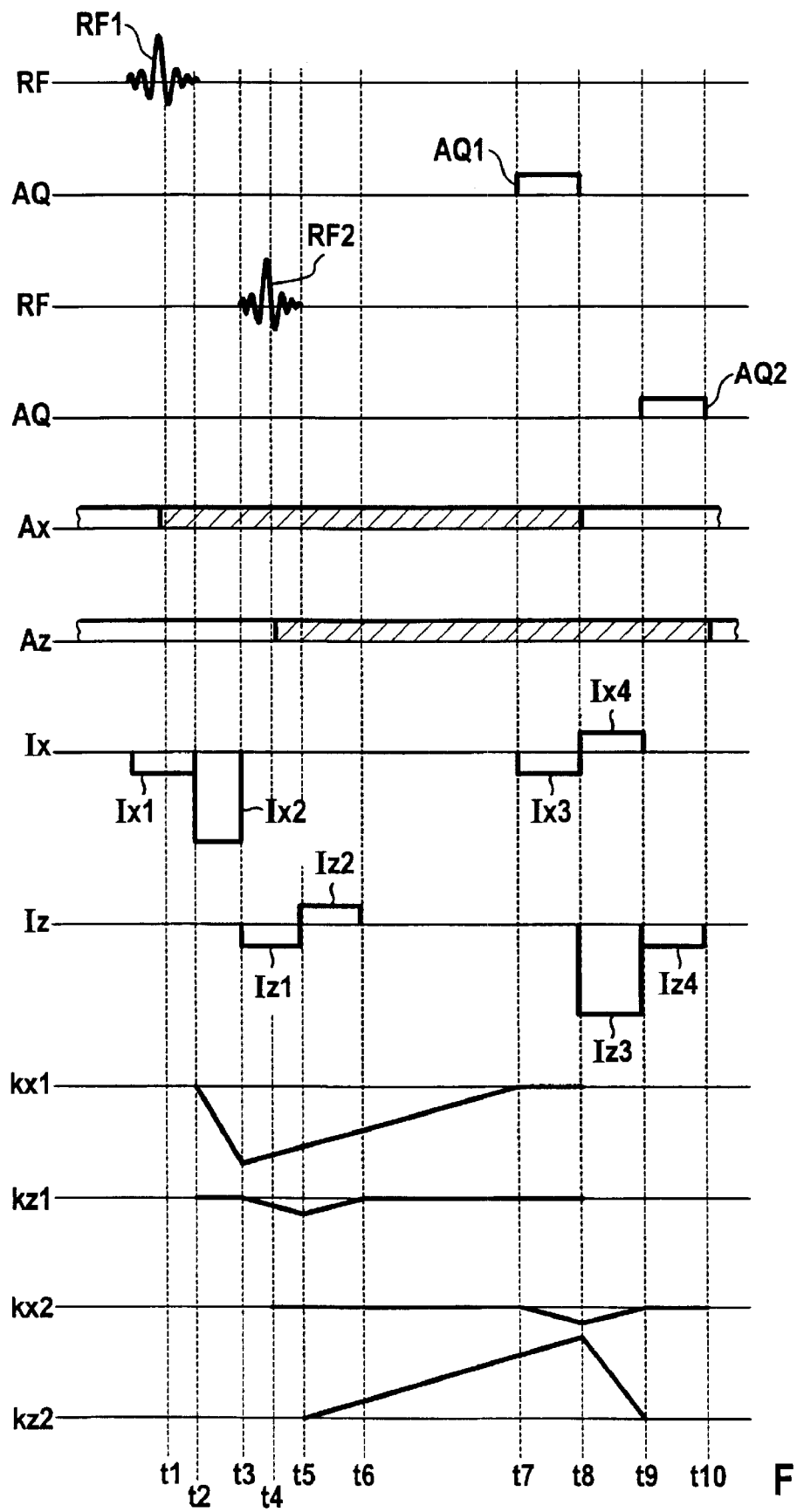
FIG. 4 illustrates an example for the executive sequence of a measuring sequence in accordance with the invention with pulse-like control of the shim currents.

A corresponding example, applied to the multi-slice method shown in FIG. 3, is explained in greater detail below with reference to FIG. 4. As stated, the problem is that different magnetic field inhomogeneities prevail in the different slices. It is assumed in the example that the inhomogeneity in the x-direction, described by a term Ax, prevails in the slice 1 and the inhomogeneity described by a term Az prevails in the z-direction in the second slice. In practice, of course, different inhomogeneities in a number of directions will be involved; for the explanation of the effect of the invention, however, the simplified description for one term in different directions suffices.

During the excitation phase, i.e. while the radio-frequency pulse RCA is being radiated, the inhomogeneity in this slice is compensated by a current pulse Ix1 that compensates the inhomogeneity in the x-direction via a corresponding shim coil. It is thus assured that the vector of the resulting slice selection gradient points in the correct direction and has the correct magnitude, so that the selected slice is exactly positioned.

At point-in-time t2 after the end of the excitation phase, a current pulse Ix2 is activated. This is dimensioned as follows: a field inhomogeneity Ax that causes a dephasing of the excited nuclear spins is effective from the point-in-time t2 to the beginning of the readout interval at a point-in-time t7. This dephasing is proportional to the time integral over the field errors. The current pulse Ix2 is then dimensioned such that the field/time integral of the shim magnetic field produced by this current Ix2 is oppositely equal to the time integral over the field inhomogeneity. The spins at the beginning of the readout interval point-in-time t7 thus are rephased exactly as in the conventional way, the field inhomogeneity being thoroughly compensated. In the readout interval itself between the points-in-time t7 and t8, the field inhomogeneity that is present in the slice that is read out is thoroughly compensated by a current pulse Ix3 in order to avoid an amplitude change, or rotation of the resulting readout gradient.

In the second slice, which is excited by the radio-frequency pulse RF2 between the points-in-time t3 and t5, one proceeds as follows. During the excitation itself, the inhomogeneity in the z-direction described by the coefficient Az is completely compensated by a negative current pulse Iz1. A current pulse Iz2 in the positive current direction subsequently follows, this exhibiting the opposite time integral of the current pulse Iz1. The current pulse Iz2 is only activated dependent on the signal in the first slice, as becomes clear later when considering the corresponding k-space paths. A negative current pulse Iz3 is activated before the readout interval between the points-in-time t8 and t9. This is dimensioned such that the integral of the generated shim magnetic field over the time is oppositely equal to the integral over the field error Az in the second slice from point-in-time t5 through point-in-time t9, plus the integral over the shim magnetic field generated by the current pulse Iz2. The dephasing caused by the magnetic field inhomogeneity thus is compensated in turn at the beginning of the readout interval from the second slice, i.e. at point-in-time t9. A current pulse Iz4 is activated during the readout interval between the points-in-time t9 and t10, whereby the shim magnetic field thereby generated compensates the field inhomogeneity Az.

The effect of the pulse/shim procedures presented herein becomes clearest given observation of the k-space paths resulting from the field inhomogeneities and shim fields. These are separately considered for kx and kz. Since the field inhomogeneities act differently in the two slices 1 and 2 under consideration, a total of 4k-space paths are considered, namely the k-space paths kx1 and kz1 in the slice 1 and kx2 and kz2 in the slice 2 are considered.

In slice 1, the k-space path kx1 as well as the k-space path kz1 in the excitation field first proceeds on the zero line since the field inhomogeneity Ax existing in the slice 1 is completely compensated by the current pulse Ix1. As a result of the current pulse Ix2, the k-space path first proceeds significantly in the negative direction. The field inhomogeneity Ax is effective between the point-in-time t3 and the point-in-time t7, so that the k-space path proceeds in the positive direction and again reaches the zero line at point-in-time t7. The k-space path again proceeds on the zero line during the readout interval between points-in-time t7 and t8, since the field inhomogeneity Ax is completely compensated again by the current pulse Ix3 in this time interval.

No inhomogeneity prevails in the z-direction in the slice 1, so that the k-space path would inherently proceed on the zero line. The shim magnetic field generated by the current pulse Iz1, however, also acts on the layer 1 and thus causes the k-space path thereat to proceed in the negative z-direction.

Due to the positive current pulse Iz2, however, the k-space path kz1 again reaches the zero line. The spins during the readout window AQ1 of the nuclear spins thus are completely rephased in the slice 1.

A consideration of the slice 2 yields the following.

During the excitation by the radio-frequency RF2, the field inhomogeneity prevailing in this slice is completely compensated, so that the k-space path kz2 remains on the zero line. Subsequently, the k-space path kz2 increases due to the influence of the inhomogeneity Az prevailing in the slice 2, until it again proceeds onto the zero line at point-in-time t8 as a result of the current pulse Iz3. The k-space path kz2 remains on the zero line during the readout interval AQ2.

In conformity with the initial assumptions, no inhomogeneity prevails in x-direction, due to the current pulse Ix3, however, a dephasing shim magnetic field is generated in the second slice. The effect thereof is that the k-space path proceeds in negative direction. Due to the current pulse Ix4, however, the k-space path is again returned onto the zero line before the beginning of the readout interval.

It can be seen that, due to the pulse-like rephasing of the nuclear spins, a designational rephasing of two simultaneously existing k-space paths is possible, whereas only one of the k-space paths can be brought to zero given conventional methods wherein shim currents are constantly set for the entire duration of the measurement. The fact is exploited that the only thing ultimately of concern is the k-space position during excitation and during readout, whereas the k-space positions lying therebetween are irrelevant. The aforementioned example having two simultaneously existing k-space paths can be expanded without further difficulty to a number of simultaneously existing k-space paths. Stated in general terms, the individual influencing of a number of simultaneously existing k-space paths which is possible with the pulse shimming can always be utilized when the k-space paths differ in a succession of gradient echo, spin echo and stimulated echo paths. This can occur because, for example, that the excitation and/or readout points-in-time of nuclear magnetic resonance signals differ.

In terms of hardware, only a slight modification is required compared to conventional systems. The power supplies SH1 through SH6 of the shim coils 4 through 9 in conventional systems are not designed for pulse-like switching with the speed required here, however, they can be equipped for meeting this demand without great outlay.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for shimming a magnet system of magnetic resonance tomography apparatus comprising the steps of:

obtaining magnetic resonance data from an examination subject and entering said data into k-space along at least one k-space path;

providing a shim channel and charging said shim channel with a shim current and modifying said shim current during a time in which said data are being entered into k-space along said at least ane k-space path.

2. A method as claimed in claim 1 wherein said magnetic resonance tomography apparatus has a field inhomogeneity associated therewith and wherein said shim current generates a shim field, and wherein the step of entering said data into k-space comprises entering said data into k-space along a plurality of simultaneously existing k-space paths, and controlling said shim current so that a time integral over said field inhomogeneity and said shim field is zero at a rephasing time of each magnetic resonance signal.

3. A method as claimed in claim 2 wherein said plurality of k-space paths are respectively allocated to different locations relative to said examination subject.

4. A method as claimed in claim 1 wherein the step of obtaining said magnetic resonance data includes exciting nuclear spins in an excitation interval and reading out said magnetic resonance data in a readout interval, and maintaining said shim current constant during said excitation interval and during said readout interval.

5. A magnetic resonance tomography apparatus comprising:

a scanner having a basic field magnet which produces a basic magnetic field having a field inhomogeneity associated therewith;

at least one shim coil charged with a current for producing a shim field for compensating said field inhomogeneity;

means for exciting nuclear spins in said examination subject and for reading out resulting magnetic resonance signals from said examination subject; and control means for charging said shim coil with said current for modifying said curient between a time of excitation of said nuclear spins and a time of readout of said magnetic resonance signals.

\* \* \* \* \*